United States Patent
Jung et al.

(10) Patent No.: US 10,971,701 B2
(45) Date of Patent: Apr. 6, 2021

(54) TRANSPARENT DISPLAY DEVICES AND METHODS OF MANUFACTURING TRANSPARENT DISPLAY DEVICES

(71) Applicant: Samsung Display Co., Ltd., Yongin-si (KR)

(72) Inventors: Seung-Ho Jung, Hwaseong-si (KR); Chaun-Gi Choi, Hwaseong-si (KR); Young-Sik Yoon, Seoul (KR); Joo-Hee Jeon, Anyang-si (KR); Hye-Young Park, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/695,211

(22) Filed: Nov. 26, 2019

(65) Prior Publication Data

US 2020/0099011 A1 Mar. 26, 2020

Related U.S. Application Data

(62) Division of application No. 14/806,246, filed on Jul. 22, 2015, now Pat. No. 10,510,984.

(30) Foreign Application Priority Data

Oct. 13, 2014 (KR) .................. 10-2014-0137305

(51) Int. Cl.
*H01L 51/52* (2006.01)
*H01L 51/56* (2006.01)
(Continued)

(52) U.S. Cl.
CPC ........ *H01L 51/5253* (2013.01); *H01L 51/003* (2013.01); *H01L 51/004* (2013.01);
(Continued)

(58) Field of Classification Search
CPC .................................................. H01L 27/3244
See application file for complete search history.

(56) References Cited

U.S. PATENT DOCUMENTS 9,147,860 B2 * 9/2015 Ozawa ................ H01L 51/5228
2007/0145354 A1 6/2007 Birau et al.
(Continued)

FOREIGN PATENT DOCUMENTS

JP 2012-171984 9/2012
KR 10-2003-0008409 1/2003
(Continued)

OTHER PUBLICATIONS

Seung-Yeon Kwak, et al., Thermally Stable, Dye-Bridged Nanohybrid-Based White Light-Emitting Diodes, Advanced Materials, Nov. 7, 2011, pp. 5767-5772, 23, WILEY-VCH Verlag GmbH & Co. KGaA, Weinheim, Germany.
(Continued)

*Primary Examiner* — Yu-Hsi D Sun
(74) *Attorney, Agent, or Firm* — H.C. Park & Associates, PLC

(57) ABSTRACT

A transparent organic light emitting display device may include a transparent base substrate, a semiconductor device disposed on the transparent base substrate, a display structure electrically connected to the semiconductor device, and a protection layer including a blue dye disposed on the display structure. The protection layer may improve the transparency of the transparent base substrate by calibrating discoloration of the transparent base substrate. Thus, the transparent display device including the protection layer may ensure an enhanced transparency. Further, the transparent display device may have an enhanced mechanical strength and an increased heat resistance because of the transparent base substrate.

10 Claims, 9 Drawing Sheets

(51) Int. Cl.
*H01L 51/00* (2006.01)
*H01L 27/32* (2006.01)

(52) U.S. Cl.
CPC ...... *H01L 51/0051* (2013.01); *H01L 51/0096* (2013.01); *H01L 51/0097* (2013.01); *H01L 51/5246* (2013.01); *H01L 51/56* (2013.01); *H01L 27/3244* (2013.01); *H01L 2227/323* (2013.01); *H01L 2227/326* (2013.01); *H01L 2251/5323* (2013.01); *H01L 2251/5338* (2013.01); *Y02E 10/549* (2013.01); *Y02P 70/50* (2015.11)

(56) References Cited

U.S. PATENT DOCUMENTS

| | | |
|---|---|---|
| 2010/0167178 A1 | 7/2010 | Yamato et al. |
| 2013/0264724 A1 | 10/2013 | Telgenbüscher et al. |
| 2013/0280529 A1 | 10/2013 | Toyama et al. |
| 2015/0028314 A1 | 1/2015 | Kubota |

FOREIGN PATENT DOCUMENTS

| | | |
|---|---|---|
| KR | 10-2008-0081616 | 9/2008 |
| KR | 10-2009-0120825 | 11/2009 |
| KR | 10-2013-0129225 | 11/2013 |
| KR | 10-2014-0031179 | 3/2014 |
| WO | 2013/118510 | 8/2013 |

OTHER PUBLICATIONS

The Extended European Search Report dated Mar. 4, 2016, in European Patent Application No. 15188789.0.

Myeon-Cheon Choi, et al., "Polymers for flexible displays: From material selection to device applications", Progress in Polymer Science, Feb. 4, 2008, pp. 581-630, vol. 33, No. 6.

Non-Final Office Action dated Jan. 3, 2017, issued in U.S. Appl. No. 14/806,246.

Final Office Action dated Jun. 6, 2017, issued in U.S. Appl. No. 14/806,246.

Non-Final Office Action dated Apr. 23, 2018, issued in U.S. Appl. No. 14/806,246.

Final Office Action dated Sep. 26, 2018, issued in U.S. Appl. No. 14/806,246.

Non-Final Office Action dated Mar. 22, 2019, issued in U.S. Appl. No. 14/806,246.

Notice of Allowance dated Aug. 13, 2019, issued in U.S. Appl. No. 14/806,246.

Notification of Reason for Refusal for KR 10-2014-0137305 dated Feb. 8, 2021.

* cited by examiner

TRANSPARENT DISPLAY DEVICES AND METHODS OF MANUFACTURING TRANSPARENT DISPLAY DEVICES

CROSS-REFERENCE TO RELATED APPLICATIONS

This application is a divisional of U.S. patent application Ser. No. 14/806,246, filed on Jul. 22, 2015, and claims priority from and the benefit of Korean Patent Application No. 10-2014-0137305, filed on Oct. 13, 2014, each of which is hereby incorporated by reference for all purposes as if fully set forth herein.

BACKGROUND

Field

Exemplary embodiments relate to transparent display devices and methods of manufacturing transparent display devices.

Discussion of the Background

Recently, a transparent display device has been rapidly developed. In the conventional transparent display device, an image of an object before or after a transparent region of the transparent display device may be recognized by a user when the transparent display device operates in an "OFF" state. In an "ON" state of the transparent display device, an image may be displayed in a pixel region of the transparent display device.

In the conventional transparent display device, a base substrate may be formed using polyimide so as to improve the flexibility of the transparent display device. However, such a base substrate may not have a desired level of heat resistance and mechanical strength. So the conventional transparent display device may provide neither desired level of transparency nor proper mechanical strength.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide transparent display devices including transparent base substrates to enhance transparencies and mechanical strengths.

Exemplary embodiments provide method of manufacturing transparent display devices including transparent base substrates to enhance transparencies and mechanical strengths Additional aspects will be set forth in the detailed description which follows, and, in part, will be apparent from the disclosure, or may be learned by practice of the inventive concept.

According to one aspect of the invention, there is provided a transparent organic light emitting display device including a transparent base substrate, a semiconductor device disposed on the transparent base substrate, a display structure electrically connected to the semiconductor device, and a protection layer including a blue dye disposed on the display structure.

In example embodiments, the protection layer may include an adhesion film and a protection film. The blue dye may be contained in at least one of the adhesion film and the protection film. For example, the adhesion film may include a pressure sensitive adhesive (PSA) containing the blue dye.

In example embodiments, the adhesion film may include a polymer polymerized with a monomer and the blue dye. The adhesion film may include an acryl-based resin combined with the blue dye.

In some example embodiments, the transparent organic light emitting display device may additionally include an encapsulation layer covering the display structure. The adhesion film may be attached to the encapsulation layer.

In example embodiments, the blue dye may include anthraquinone-based blue dye, azo-based blue dye and/or phthalocyanine-based blue dye.

In some example embodiments, the protection layer may include blue pigment particles.

In example embodiments, the transparent base substrate may be a transparent polymer substrate or a colored polymer substrate. For example, the colored polymer substrate may include a polyimide-based material containing an electron donor unit combined between adjacent imide units, and a charge transfer complex formed by a molecular interaction between the electron donor unit and the imide unit serving as an electron acceptor unit. The colored polymer substrate may have a yellow color. Additionally, the transparent base substrate may include a transparent polyimide-based material.

In example embodiments, the display structure includes an organic light emitting layer or a liquid crystal layer. In this case, the display structure may include a first electrode electrically connected to the semiconductor device, and a second electrode opposed to the first electrode. The organic light emitting layer or the liquid crystal layer may be disposed between the first electrode and the second electrode.

According to one aspect of the invention, there is provided a method of manufacturing a transparent organic light emitting display device. In the method, a transparent base substrate may be formed on a carrier substrate. A semiconductor device may be formed on a transparent base substrate. An insulation layer may be formed on the transparent base substrate to substantially cover the semiconductor device. A display structure may be formed on the insulation layer. The display structure may be electrically connected to the semiconductor device. An encapsulation layer may be formed to substantially cover the display structure. A protection layer including a blue dye may be formed on the encapsulation layer.

When forming the protection layer according to example embodiments, an adhesion film may be formed on a surface of a protection film. The blue dye may be contained in the adhesion film and/or the protection film.

In some example embodiments, the adhesion film may be attached to the encapsulation layer.

When forming the adhesion film according to example embodiments, an adhesion composition containing the blue dye, a monomer, a polymerization initiator and a solvent may be coated on the surface of the protection film. Here, a polymer resin may be formed by a polymerization of the blue dye and the monomer. The monomer may include an acryl-based monomer and the polymer resin may include an acryl-based resin combined with the blue dye. Examples of the acryl-based monomer may include methacrylic acid, acrylic acid, methyl methacrylate, benzyl methacrylate, 2-hydroxyethyl methacrylate, aryl methacrylate and/or glycidyl methacrylate.

When forming the protection layer according to some example embodiments, an adhesion film may be formed on an upper surface of the encapsulation layer. A protection film may be formed on the adhesion film. Here, the blue dye may be contained in at least one of the adhesion film and the protection film.

In the formation of the adhesion film according to some example embodiments, an adhesion composition containing the blue dye, a monomer, a polymerization initiator and a solvent may be coated onto the upper surface of the encapsulation layer. Here, a polymer resin may be formed by a polymerization of the blue dye and the monomer.

In example embodiments, the transparent base substrate may be attached on a carrier substrate, and then the carrier substrate may be separated from transparent base substrate after forming the encapsulation layer. Alternatively, the carrier substrate may be separated after forming the protection layer.

According to example embodiments, the adhesion film and/or the protection film containing the blue dye may improve the transparency of the transparent base substrate by calibrating discoloration of the transparent base substrate. Thus, the transparent display device including the protection layer may provide an enhanced transparency. Moreover, the transparent base substrate may have an enhanced mechanical strength and an increased heat resistance because of the charge transfer complex, so that the transparent display device may also have an enhanced mechanical strength and an increased heat resistance.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE EMBODIMENTS

Figure 1:
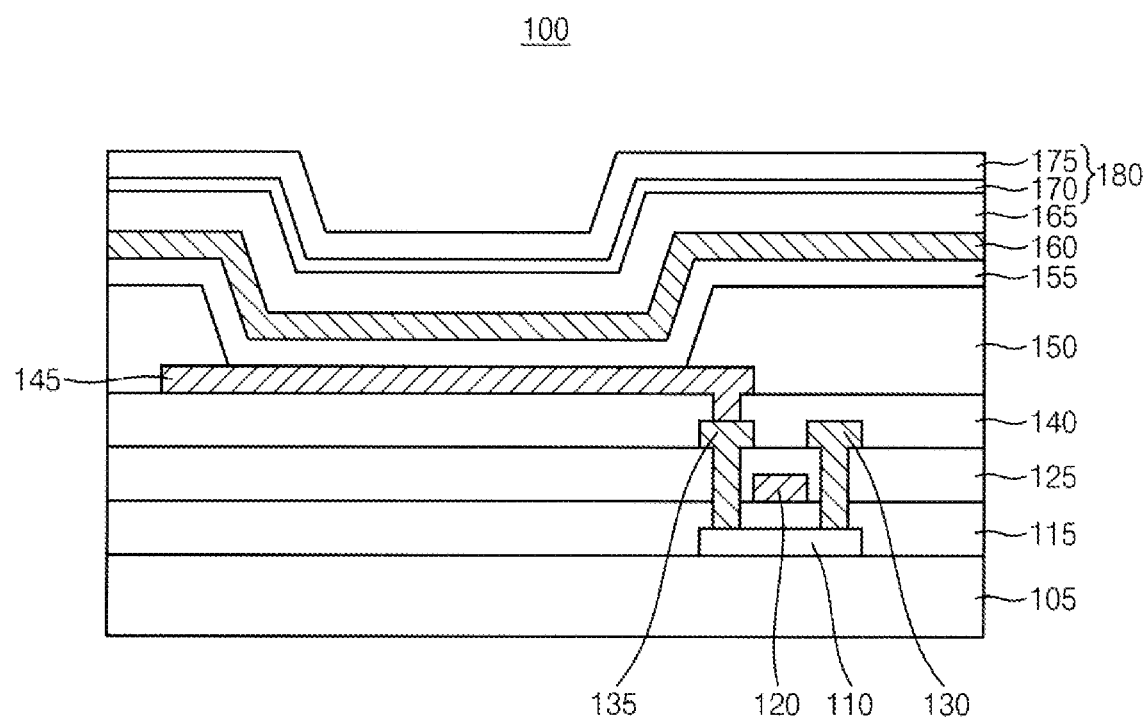
FIG. 1 is a cross-sectional view illustrating a transparent display device in accordance with example embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a cross-sectional view illustrating a transparent display device in accordance with example embodiments.

Referring to FIG. 1, a transparent display device 100 may include a transparent base substrate 105, a semiconductor device, a display structure, an encapsulation layer 165, a protection layer 180, etc.

The transparent base substrate 105 may support the elements of the transparent display device 100. For example, the transparent base substrate 105 may include a polymer having a desired flexibility, and thus the transparent display device 100 may be a flexible transparent display device.

In example embodiments, the transparent base substrate 105 may include a polyimide-base material. Here, an electron donor unit may be combined with adjacent nitrogen atoms of an imide unit contained in the polyimide-base material. Examples of the electron donor unit may include an aromatic ring such as benzene. The imide unit in the polyimide-base material may serve as an electron acceptor unit. A charge transfer complex (CTC) may be formed because of the molecular interaction between the electron donor unit and the electron acceptor unit. Accordingly, the transparent base substrate 105 may have an enhanced heat resistance and an improved mechanical strength. The charge transfer complex may absorb a light having a wavelength of about 560 nm to about 580 nm so that the transparent base substrate 105 may be a colored base substrate having, for example, a yellow color.

In some example embodiments, functional groups having a relatively high electronegativity such as —$CF_3$ or —$SiO_2$ may be introduced between the imide units or into the imide unit. This may decrease the electron density of the imide unit and suppress the formation of the charge transfer complex. Further, a relatively bulky functional group containing a plurality of aromatic rings may be introduced between the imide units or into the imide unit, which may inhibit the formation of the charge transfer complex. Accordingly, the transparent base substrate 105 may serve as a substantially transparent polymer substrate. That is, the transparent polymer substrate may include a polyimide-base material.

The semiconductor device may be disposed on the transparent base substrate 105. The semiconductor device may include a thin film transistor (TFT). Additionally, wirings electrically connected to the semiconductor device may be arranged on the transparent base substrate 105. In some example embodiments, the semiconductor device may include an active pattern 110, a gate insulation layer 115, a gate electrode 120, a source electrode 130 and a drain electrode 135.

Although it is not shown, a barrier layer may be additionally disposed on the transparent base substrate 105. The barrier layer may have a structure in which silicon compound layers containing silicon oxide ($SiO_x$) or silicon nitride ($SiN_x$) may be stacked on the transparent base substrate 105. The barrier layer may prevent oxygen and/or moisture from being permeated into the transparent base substrate 105.

In example embodiments, a buffer layer (not illustrated) may be disposed on the barrier layer. The buffer layer may include a silicon compound, for example, silicon oxide, silicon nitride, silicon oxynitride ($SiO_xN_y$), etc. The buffer layer may have a single layer structure or a multilayer structure. The buffer layer may prevent the diffusion of impurities, metal ions and/or moisture toward the overlying structures.

The active pattern 110 of the semiconductor device may be disposed on the transparent base substrate 105 or the buffer layer. The active pattern 110 may include polysilicon, amorphous silicon, partially crystallized silicon, microcrystal containing silicon, etc. Alternatively, the active pattern 110 may include oxide semiconductor.

The gate insulation layer 115 may be disposed on the transparent base substrate 105 to substantially cover the active pattern 110. The gate insulation layer 115 may include a silicon compound, for example, silicon oxide, silicon nitride, silicon oxynitride, etc.

The gate electrode 120 may be disposed on the gate insulation layer 115. The gate electrode 120 may be positioned on a portion of the gate insulation layer 115 under which the active pattern 110 is located. The gate electrode 120 may include metal, alloy, metal nitride, etc. For example, the gate electrode 120 may include molybdenum (Mo), alloy containing molybdenum, aluminum (Al), alloy containing aluminum, aluminum nitride ($AlN_x$), silver, alloy containing silver, tungsten (W), tungsten nitride ($WN_x$), copper (Cu), alloy containing copper, nickel (Ni), titanium (Ti), titanium nitride ($TiN_x$), platinum (Pt), tantalum (Ta), tantalum nitride ($TaN_x$), etc. Alternatively, the gate electrode 120 may include a transparent conductive material such as indium tin oxide, indium zinc oxide, etc.

An insulating interlayer 125 may be disposed on the gate insulation layer 115 and the gate electrode 120. The insulating interlayer 125 may include a silicon compound, for example, silicon oxide, silicon nitride, etc.

The source electrode 130 and the drain electrode 135 may be disposed on the insulating interlayer 125. The source and the drain electrodes 130 and 135 may pass through the insulating interlayer 125 and the gate insulation layer 115, and then may contact the active pattern 110. Each of the source and the drain electrodes 130 and 135 may include metal, alloy, metal nitride, conductive metal oxide, etc. Alternatively, each of the source and the drain electrodes 130 and 135 may include a transparent conductive material.

The wirings may be electrically connected to the semiconductor device. For example, the wirings may include a scan line electrically connected to the gate electrode 120, and a data line electrically connected to the source electrode 130.

An insulation layer 140 may be disposed on the insulating interlayer 125 to cover the semiconductor device and the wirings. For example, the insulation layer 140 may include acryl-based resin, polyimide-based resin, epoxy-based resin, polyester-based resin, etc.

The display structure may be disposed on the insulation layer 140. The display structure may include a first electrode 145, a display layer 155 and a second electrode 160.

The first electrode 145 may be positioned on the insulation layer 140. The first electrode 145 may be electrically connected to the drain electrode 135. For example, the first electrode 145 may pass through the insulation layer 140, and then may contact the drain electrode 135. The first electrode 145 may include metal, alloy, metal nitride, conductive metal oxide, etc. The first electrode 145 may serve as a reflective electrode or a transmissive electrode in accordance with the type of the transparent display device 100.

A pixel defining layer 150 may be disposed the insulation layer 140. The pixel defining layer 150 may substantially cover a peripheral portion of the first electrode 145, and may define a display region, a pixel region or a luminescent region of the transparent display device 100. For example, the pixel defining layer 150 may include photoresist, acryl-based resin, polyimide-based resin, polyamide-based resin, etc.

The display layer 155 may be located on the first electrode 145. In example embodiments, the display layer 155 may include an organic light emitting layer. Here, the transparent display device 100 may be a transparent organic light emitting display device. The organic light emitting layer may additionally include a hole transfer layer (HTL), an electron transfer layer (ETL), etc.

In some example embodiments, the display layer 155 may include a liquid crystal layer, and thus the transparent display device 100 may be a transparent liquid crystal display device. In this case, an alignment layer for the alignment of liquid crystal molecules may be disposed on the first electrode 145 and/or the second electrode 160.

Although the display layer 155 extends on the pixel defining layer 150 from the first electrode 145 in FIG. 1, the display layer 155 may be confined by a pixel opening of the pixel defining layer exposing the first electrode 145.

The second electrode 160 may be disposed on the display layer 155. For example, the second electrode 160 may extend onto the pixel defining layer 150. The second electrode 160 may include metal, metal nitride, transparent conductive metal oxide, etc.

The encapsulation layer 165 may be disposed on the second electrode 160 to cover the display structure. For example, the encapsulation layer 165 may substantially cover a front surface of the transparent display device 100. The encapsulation layer 165 may include a transparent organic material or a silicon-based material.

The protection layer 180 may be disposed on the encapsulation layer 165 to protect the display structure. In example embodiments, the protection layer 180 may include an adhesion film 170 and a protection film 175. At least one of the adhesion film 170 and the protection film 175 may contain a blue dye. Examples of the blue dye may include anthraquinone-based blue dye, azo-based blue dye, phthalocyanine-based blue dye, etc. These may be used alone or in a mixture thereof. The blue dye may selectively absorb a light having a wavelength of about 460 nm to about 480 nm.

The adhesion film 170 may include a pressure sensitive adhesive (PSA). Alternatively, the adhesion film 170 may include a polymer resin formed by a polarization of the blue dye and a monomer. For example, the adhesion film 170 may include an acryl-based resin combined with the blue dye.

The protection film 175 may be attached to the front surface of the transparent display device 100 to prevent moisture and dusts from being permeated into the transparent display device 100 from an outside. Additionally, the protection film 175 may prevent the transparent display device 100 from damages, such as scratch. In example embodiments, the protection film 175 may include the blue dye so that the protection film 175 and/or the adhesion film 170 may perform a color calibration of an image displayed on the transparent display device 100.

As described above, when the transparent base substrate 105 is the colored polymer substrate having the yellow color, the adhesion film 170 may calibrate a large yellow index caused by the charge transfer complex existing in the colored polymer substrate. For example, the blue color of the adhesion film 170 may be superimposed with the yellow color of the colored polymer substrate to achieve the transparency of the transparent base substrate 105. Therefore, the charge transfer complex may improve the mechanical strength and the heat resistance of the transparent base substrate 105 while enhancing transparency of the transparent base substrate 105 by the adhesion film 170.

In some example embodiments, when the transparent base substrate 105 is the transparent polymer substrate, it may have relatively low heat resistance and mechanical strength compared to the colored polymer substrate. Thus, the transparent base substrate 105 may be discolored such as yellowing by a thermal treatment when forming the active pattern 110 or a curing the elements such as an organic material. In this case, the adhesion film 170 may calibrate the yellowing of the transparent base substrate 105 to improve the transparency of the transparent base substrate 105.

According to example embodiments, an amount of the blue dye may be properly adjusted to address the discoloration of the transparent base substrate 105. In some example embodiments, the protection layer 180 may additionally include blue pigment particles. Examples of the blue pigment particles may include phthalocyanine-based blue pigment particles, cobalt blue-based pigment particles, prussian blue-based pigment particles, turkey blue-based pigment particles, etc. These may be used alone or in a mixture thereof. For example, the blue pigment particles may have an average diameter of about 10 nm to about 100 nm.

FIGS. 2 through 7 are cross-sectional views illustrating a method of manufacturing a transparent display device in accordance with example embodiments.

Figure 2:
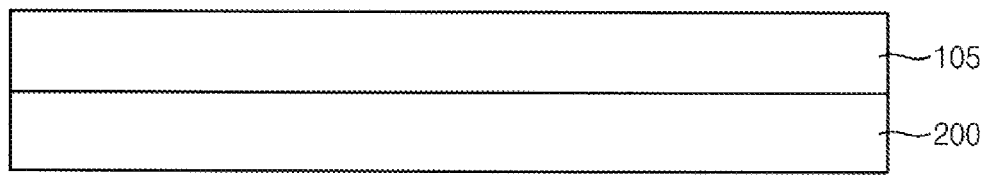
FIGS. 2 through 7 are cross-sectional views illustrating a method of manufacturing a transparent display device in accordance with example embodiments.

Referring to FIG. 2, a transparent base substrate 105 may be attached on a carrier substrate 200. The carrier substrate 200 may include, for example, a glass substrate. The transparent base substrate 105 may be the above-described colored polymer substrate or the transparent polymer substrate.

Figure 3:
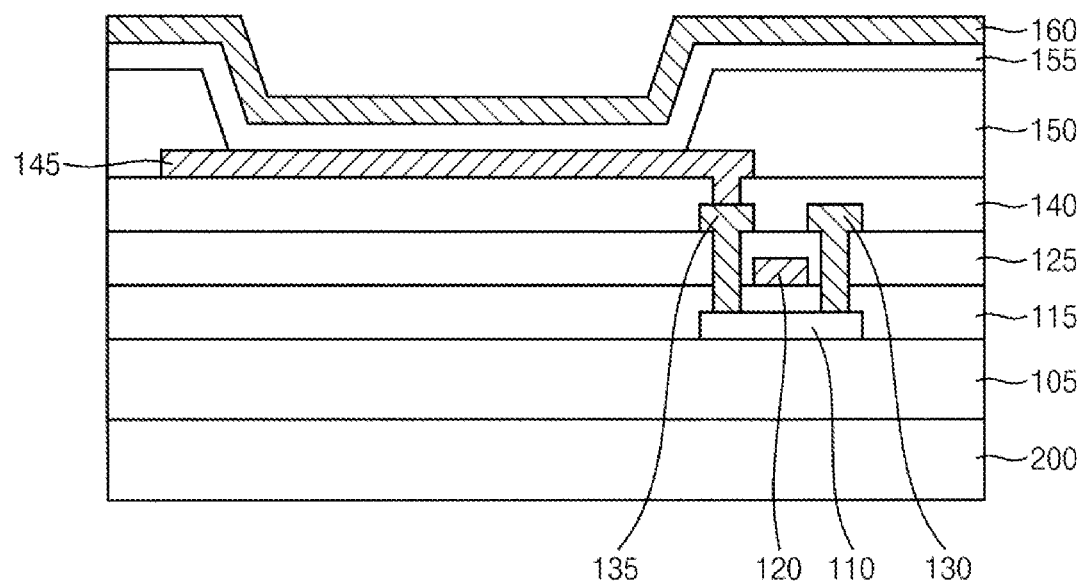

Referring to FIG. 3, a semiconductor device and wirings may be formed on the transparent base substrate 105, and then a display structure may be formed over the semiconductor device and wirings. The semiconductor device may include an active pattern 110, a gate insulation layer 115, a gate electrode 120, a source electrode 130 and a drain electrode 135. The wirings may include a scan line, a data line, etc.

Although it is not illustrated, a barrier layer may be formed on the transparent base substrate 105. The barrier layer may prevent permeation of moisture and/or oxygen into the transparent base substrate 105 from outside. The barrier layer may be formed of silicon oxide, silicon nitride, etc. Additionally, a buffer layer may be formed on the barrier layer to prevent diffusion of impurities, metal ions and/or moisture into the overlying elements of the transparent display device. The buffer layer may be formed using silicon oxide, silicon nitride, silicon oxynitride, etc.

The active pattern 110 may be formed on the buffer layer or and transparent base substrate 105. The active pattern 110 may be formed using polysilicon, amorphous silicon, partially crystallized silicon, silicon containing micro crystals, or oxide semiconductor such as indium zinc oxide, indium tin oxide, indium gallium zinc oxide, etc.

The gate insulation layer 115 may be formed on the buffer layer or the transparent base substrate 105 to substantially cover the active pattern 110. The gate insulation layer 115 may be formed of silicon oxide, silicon nitride, silicon oxynitride, etc.

The gate electrode 120 may be formed on the gate insulation layer 115. The gate electrode 120 may be located directly over the active pattern 110. The gate electrode 120 may be formed of metal, alloy, metal nitride, transparent conductive metal oxide, etc.

An insulating interlayer 125 may be formed on the gate insulation layer 115 to cover the gate electrode 120. The insulating interlayer 125 may have a substantially level upper surface. The insulating interlayer 125 may be formed using silicon oxide, silicon nitride, silicon oxynitride, etc.

The source and the drain electrodes 130 and 135 may be formed on the insulating interlayer 125. After forming contact holes exposing portions of the active pattern 110 through the insulating interlayer 125 and the gate insulation layer 115, the source and the drain electrodes 130 and 135 may be formed to substantially fill the contact holes. Each of the source and the drain electrodes 130 and 135 may be formed using metal, alloy, metal nitride, transparent conductive metal oxide, etc.

An insulation layer 140 may be formed on the insulating layer 125 to cover the source and the drain electrodes 130 and 135. The insulation layer 140 may be formed using an acryl-based resin, a polyimide-based resin, an epoxy-based resin, a polyester-based resin etc.

A display structure including a first electrode 145, a display layer 155 and a second electrode 160 may be formed in the insulation layer 140.

The first electrode 145 may be formed on the insulation layer 140. After a hole exposing the drain electrode 135 may be formed through the insulation layer 140, the first electrode 145 may be formed in the hole to contact the drain electrode 135. The first electrode 145 may be formed of a material either reflective or transmissive depending on the type of the transparent display device.

A pixel defining layer 150 may be formed on the first electrode 145 and the insulation layer 140. The pixel defining layer 150 may be formed of polyimide-based resin, photoresist, polyacryl-based resin, polyamide-based resin, acryl-based resin, etc. A pixel opening may be formed through pixel defining layer 150. The pixel opening may partially expose the first electrode 145.

The display layer 155 may be formed on the exposed first electrode 145. The display layer 155 may include an organic light emitting layer or a liquid crystal layer in accordance with the type of the transparent display device.

The second electrode 160 may be formed on the display layer 155 and the pixel defining layer 150. The second electrode 160 may serve as a common electrode between adjacent pixels. The second electrode 160 may also be formed of a material either reflective or transmissive depending on the type of the transparent display device.

Referring to FIG. 3 again, an encapsulation layer 165 (see FIG. 1) may be formed on the second electrode 160. The encapsulation layer 165 may cover the display structure. The encapsulation layer 165 may be substantially opposed to the transparent base substrate 105.

Figure 4:
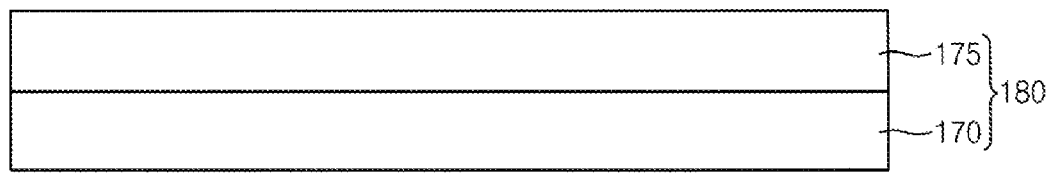

Referring to FIG. 4, a protection layer 180 may be provided. In forming of the protection layer 180 according to example embodiments, an adhesion film 170 may be formed on a protection film 175 by coating an adhesion composition containing a blue dye on a surface of the protection film 175. The adhesion composition may include the blue dye, a monomer such as an acryl-based monomer, a polymerization initiator and a solvent. The blue dye and the monomer may be combined and/or polymerized to form a polymer resin combined with the blue dye. When the acryl-based monomer is used, an acryl-based resin combined with the blue dye may be used informing the adhesion film 170.

Examples of the acryl-based monomer may include methacrylic acid, acrylic acid, methyl methacrylate, benzyl methacrylate, 2-hydroxyethyl methacrylate, aryl methacrylate, glycidyl methacrylate, etc. These may be used alone or in a mixture thereof.

Examples of the blue dye may include a compound represented by the following Formula I:

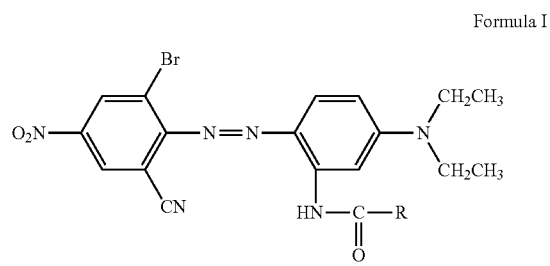

Formula I

In the above Formula I, R indicates a reactive functional group such as an alkylene group, and can combine with the acryl-based monomer by an addition reaction or a condensation reaction. For example, the acryl-based resin combined with the blue dye may be obtained by a reaction between the acryl-based monomer and the compound of Formula I. When R is —CH═CH$_2$ in the above Formula I, the acryl-based resin combined with the blue dye may be represented by the following Formula II:

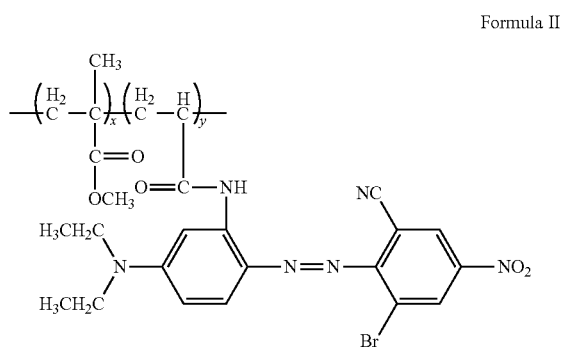

Formula II

In the above Formula II, x and y are positive integers, and the sum of x and y is in a range of about 2 to about 1,000.

In some example embodiments, the acryl-based resin combined with the blue dye may be of about 3 to about 20 percent by weight based on a total weight of the adhesion composition. When the content of the acryl-based resin combined with the blue dye is below about 3 percent by weight, the adhesion film 170 formed from the adhesion composition may have a low mechanical strength. When the content of the acryl-based resin combined with the blue dye is above 20 percent by weight, the adhesion film 170 may not be uniform in thickness.

The polymerization initiator may generate radicals by a heat or a light, and may accelerate a polymerization reaction between the monomer and the blue dye. For example, the polymerization initiator may include an azo-based compound, azonitril-based compound, an azoamide-based compound, an azoamidine-based compound, a maxro-azo-based compound, an acetophenone-based compound, a benzophenone-based compound, an oxime-based compound, etc. These may be used alone or in a mixture thereof.

The polymerization initiator may have a content of about 0.5 to about 5 percent by weight based on the total weight of the adhesion composition. When the content of the polymerization initiator is below 0.5 percent by weight, the polymerization reaction may not be able to be properly occurred. When the content of the polymerization initiator is above 5 percent by weight, the polymerization initiator may not be desirably controlled in the adhesion composition.

Examples of the solvent may include propyleneglycolmonomethylether acetate, ethylethoxypropionate, cyclohexanone, dipropyleneglycolmonomethylether acetate, n-butylacetate, isobutylacetate, ethyleneglycolmonomethylacetate, ethyleneglycol n-butylacetate, diethyleneglycoldimethylether, dipropyleneglycolmonomethylacetate, diethyleneglycolmethylether, dipropyleneglycol n-butylether, tripropyleneglycol n-butylether, tripropyleneglycolmethylether, propyleneglycolmethylether acetate, propyleneglycoldiacetate, 3-ethoxy methyl propionate, methanol, ethanol, methylcellusolvemonomethylether, ethylcellusolve acetate, diethyleneglycolmonomethylether, methylethylketone, 4-hydroxy-4-methyl-2-pentanone, 2-hydroxy-2-methylethylproprionate, etc. These may be used alone or in a mixture thereof. The solvent may have a content of about 75 to about 95 percent by weight based on the total weight of the adhesion composition.

In some example embodiments, the adhesion composition may additionally include blue pigment particles. Such blue pigment particles may enhance the color calibration of the adhesion film 170. Examples of the blue pigment particles may include phthalocyanine-based blue pigment particles, cobalt blue-based pigment particles, prussian blue-based pigment particles, turkey blue-based pigment particles, etc. These may be used alone or in a mixture thereof. For example, the blue pigment particles may have an average diameter of about 10 nm to about 100 nm. The blue pigment particles may have a content of about 1.0 to about 10.0 percent by weight based on the total adhesion composition. When the content of the blue pigment particles is above 10 percent by weight, the adhesion composition may not be properly cured.

In some example embodiments, the adhesion composition may additionally include additives such as a cross-linking agent, a surfactant, etc. The cross-linking agent may accelerate a cross-linking between the acryl-based monomer and the blue dye. For example, the cross-linking agent may include an inorganic chelating agent or an organic chelating agent. Examples of the surfactant may include FZ-2110 or FZ-2122 (Dow Corning Co., U.S.A.), or BYK-345 (BYK Co., U.S.A.).

As described above, the polymer resin combined with the blue dye may be obtained from the adhesion composition according to example embodiments. The blue dye may be desirably confined in the adhesion film 170 by directly combining the blue dye with the monomer, so that the adhesion film 170 may have an improved reliability. Further, the blue dye may be contained in the polymer resin to prevent the localization of the blue dye. Therefore, the transparent base substrate 105 may have an entirely uniform transparency because of uniform distribution of the blue dye in the adhesion film 170.

In some example embodiments, the adhesion composition may be cured by a thermal treatment of a UV irradiation after attaching the adhesion film 170 to the surface of the protection film 175. By curing the adhesion composition, the blue dye and the monomer may be combined and/or condensed to obtain the polymer resin combined with the blue dye.

In other example embodiments, the blue dye may be distributed in the adhesion composition. Here, the monomers may be polymerized and/or co-polymerized to obtain the polymer resin combined with the blue dye.

Figure 5:
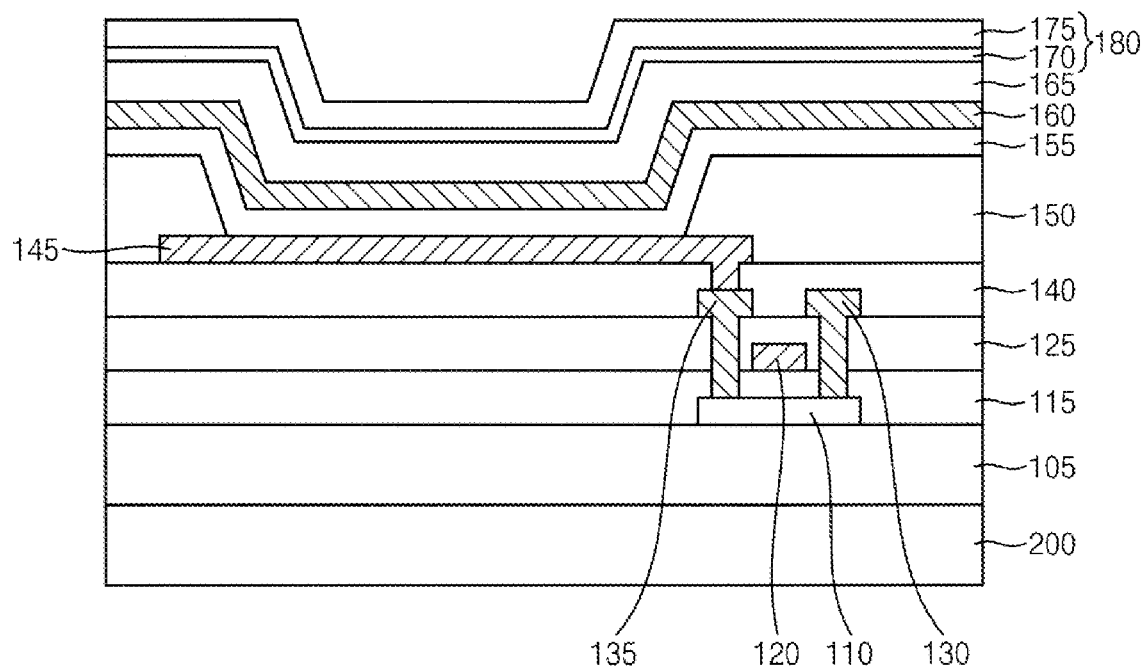

Referring to FIG. 5, the protection layer 180 may be attached to the encapsulation layer 165. The protection layer 180 may prevent the underlying structures from impurities, moisture, scratch, etc. For example, the protection film 175 may include a transparent resin such as polyethylene terephthalate (PET), polycarbonate (PC), polyvinyl chloride (PVC), etc. In example embodiments, the protection film 175 may be formed using a transparent resin containing the above-described blue dye. Accordingly, the protection film 175 may also perform the color calibration of the image as the adhesion film 170.

In some example embodiments, an optical layer and an additional transparent substrate may be provided on the protection layer 180.

Figure 6:
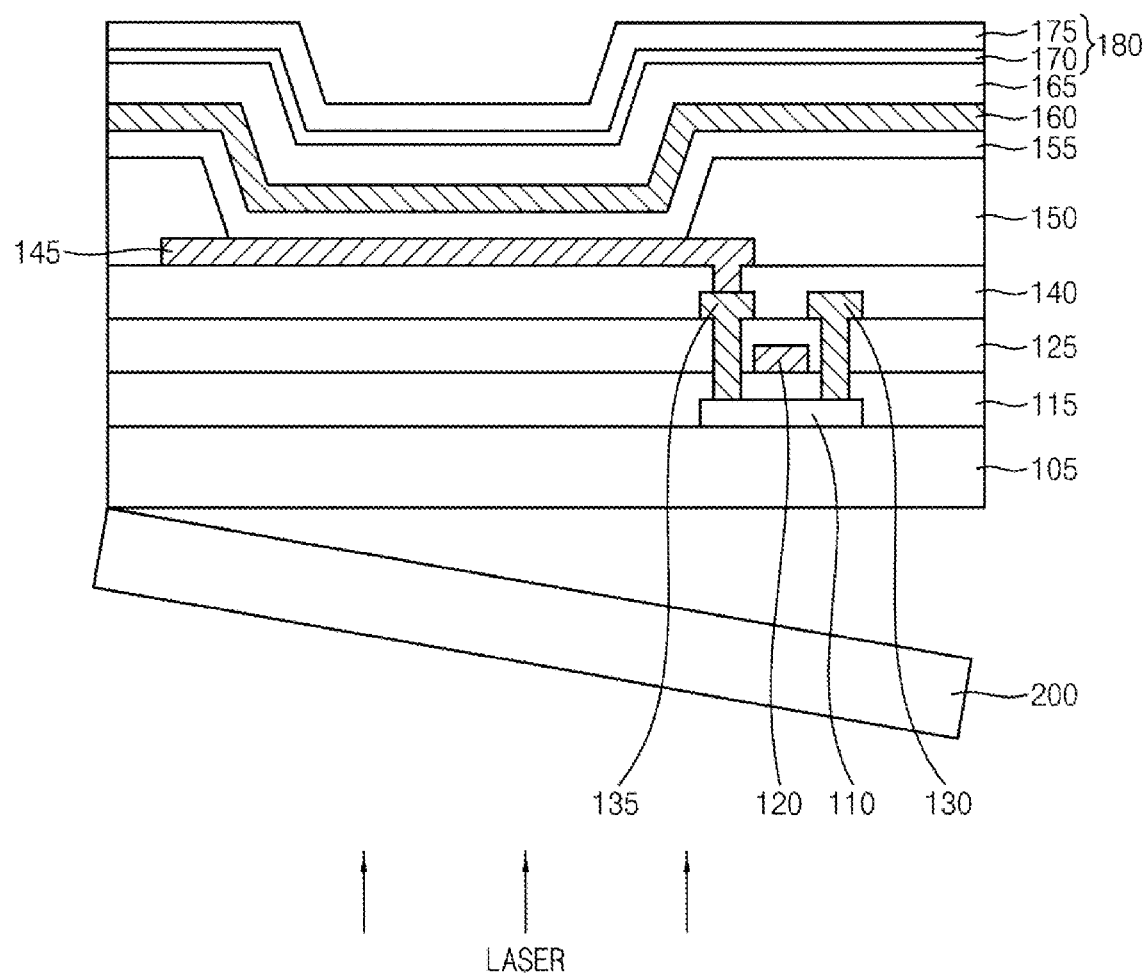
Figure 7:
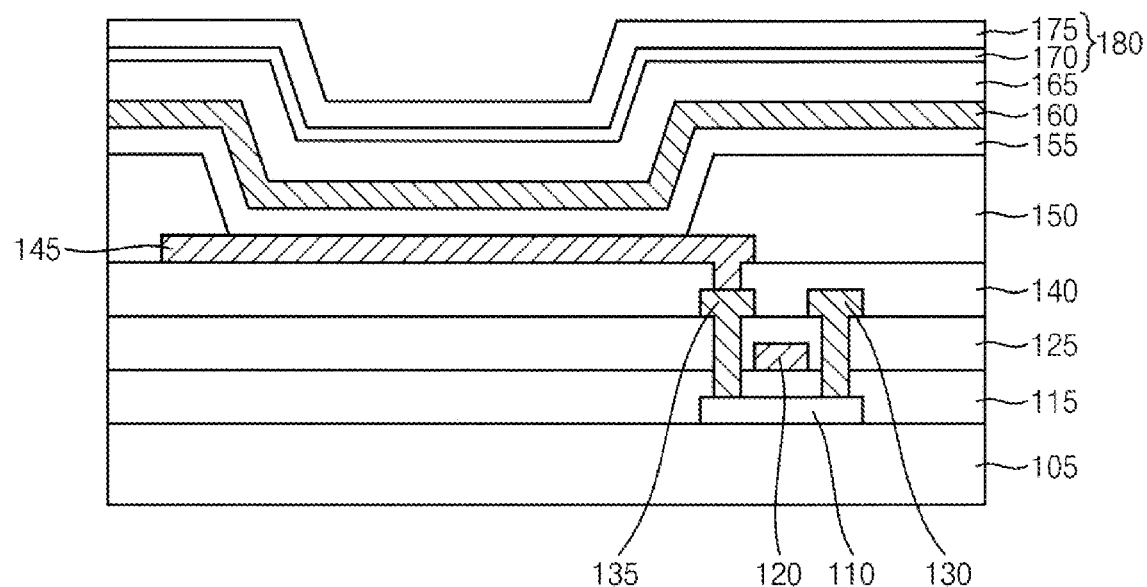

Referring to FIGS. 6 and 7, the carrier substrate 200 may be separated from the transparent base substrate 105. For example, the carrier substrate 200 may be detached from the transparent base substrate 105 by irradiating a laser onto an interface between the carrier substrate 200 and the transparent base substrate 105. Alternatively, the carrier substrate 200 may be separated by applying mechanical force to the interface between the carrier substrate 200 and the transparent base substrate 105.

The carrier substrate 200 may be separated after forming the adhesion film 170 and the protection film 175 on the encapsulation layer 165. In some example embodiments, the carrier substrate 200 may be separated from the transparent base substrate 105 before forming the protection layer 180 on the encapsulation layer 165.

FIGS. 8 to 14 are cross-sectional views illustrating a method of manufacturing a transparent display device in accordance with some example embodiments. In the method illustrated in FIGS. 8 to 14, detailed descriptions of processes and/or elements substantially the same as the processes and/or the elements described with reference to FIGS. 2 to 7 will be omitted.

Figure 8:
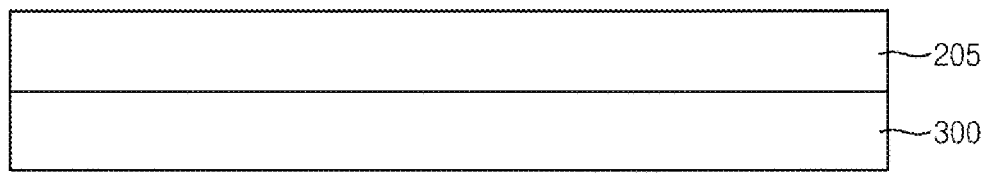
FIGS. 8 through 14 are cross-sectional views illustrating a method of manufacturing a transparent display device in accordance with some example embodiments.

Referring to FIG. 8, a transparent base substrate 205 such as a colored polymer substrate or a transparent polymer substrate may be formed on a carrier substrate 300 such as a glass substrate.

Figure 9:
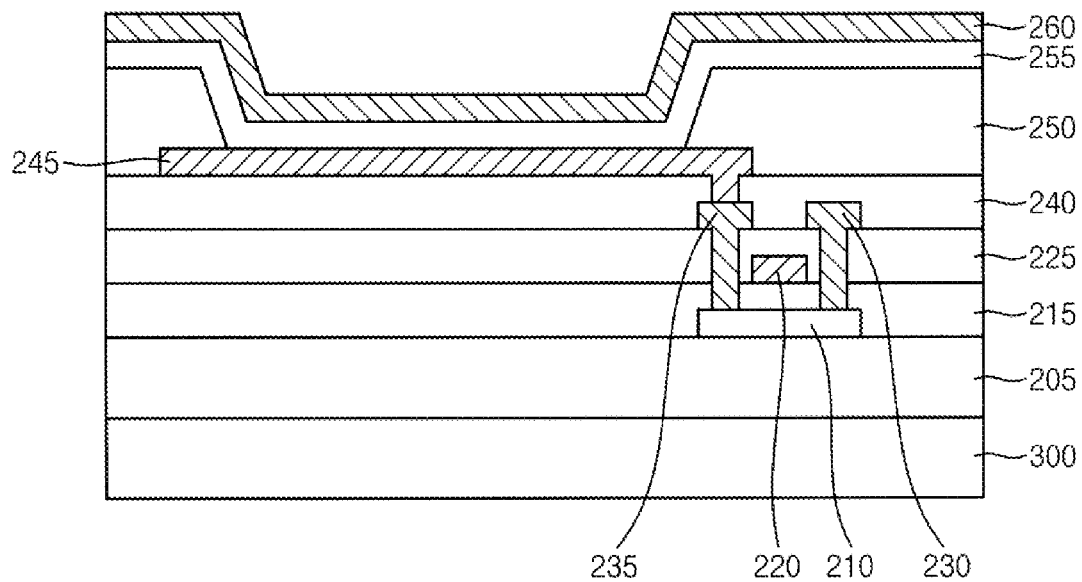

Referring to FIG. 9, a semiconductor device and wirings may be formed on the transparent base substrate 205. The semiconductor device may include an active pattern 210, a gate insulation layer 215, a gate electrode 220, a source electrode 230 and a drain electrode 235. The wirings may be electrically connected to the semiconductor device.

Although it is not illustrated, a barrier layer may be formed on the transparent base substrate 205 so as to prevent the permeation of moisture and/or oxygen into the transparent base substrate 205. The barrier layer may be formed using silicon oxide, silicon nitride, etc. Further, a buffer layer may be formed on the barrier layer to prevent the diffusion of impurities, metal ions and/or moisture into the overlying elements of the transparent display device. The buffer layer may be formed using silicon oxide, silicon nitride, silicon oxynitride, etc.

The active pattern 210 may be formed on the buffer layer or and transparent base substrate 205 using polysilicon, amorphous silicon, partially crystallized silicon, silicon containing micro crystals, or oxide semiconductor such as indium zinc oxide, indium tin oxide, indium gallium zinc oxide, etc.

The gate insulation layer 215 may be formed on the buffer layer or the transparent base substrate 205 to substantially cover the active pattern 210. The gate insulation layer 215 may be formed using silicon oxide, silicon nitride, silicon oxynitride, etc.

The gate electrode 220 may be formed on the gate insulation layer 215 using metal, alloy, metal nitride, transparent conductive metal oxide, etc. The gate electrode 120 may be located directly over the active pattern 210.

An insulating interlayer 225 may be formed on the gate insulation layer 215 to cover the gate electrode 220 using silicon oxide, silicon nitride, silicon oxynitride, etc. The insulating interlayer 225 may have a substantially flat upper surface.

The source and the drain electrodes 230 and 235 may be formed on the insulating interlayer 225. The source and the drain electrodes 230 and 235 may pass through the insulating interlayer 225 and the gate insulation layer 215, and then may make contact a source region and a drain region of the active pattern 210, respectively. Each of the source and the drain electrodes 230 and 235 may be formed using metal, alloy, metal nitride, transparent conductive metal oxide, etc.

An insulation layer 240 may be formed on the insulating layer 225 to cover the source and the drain electrodes 230 and 235 using an acryl-based resin, a polyimide-based resin, an epoxy-based resin, a polyester-based resin etc.

A display structure including a first electrode 245, a display layer 255 and a second electrode 260 may be formed in the insulation layer 240. The first electrode 245 may pass through the insulation layer 240 and may contact the drain electrode 235. The first electrode 245 may be formed using a material having a reflectivity or a transmittance in accordance with the emission type of the transparent display device.

A pixel defining layer 250 may be formed on the first electrode 245 and the insulation layer 240 using polyimide-based resin, photoresist, polyacryl-based resin, polyamide-based resin, acryl-based resin, etc. A pixel opening partially exposing the first electrode 245 may be formed through pixel defining layer 250.

The display layer 255 may be formed on the exposed first electrode 245. The display layer 255 may include an organic light emitting layer or a liquid crystal layer in accordance with the type of the transparent display device.

The second electrode 260 may be formed on the display layer 255 and the pixel defining layer 250 using a material having a reflectivity or a transmittance in accordance with the emission type of the transparent display device. The second electrode 260 may serve as a common electrode between adjacent pixels.

Figure 10:
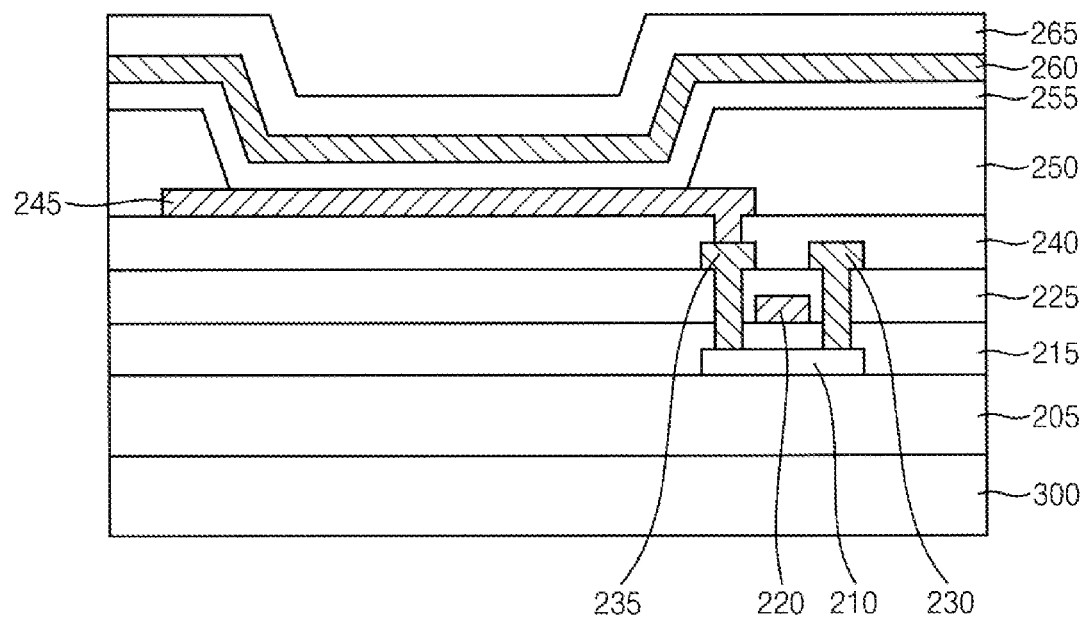

Referring to FIG. 10, an encapsulation layer 265 may be formed on the second electrode 260 to protect the display structure.

Figure 11:
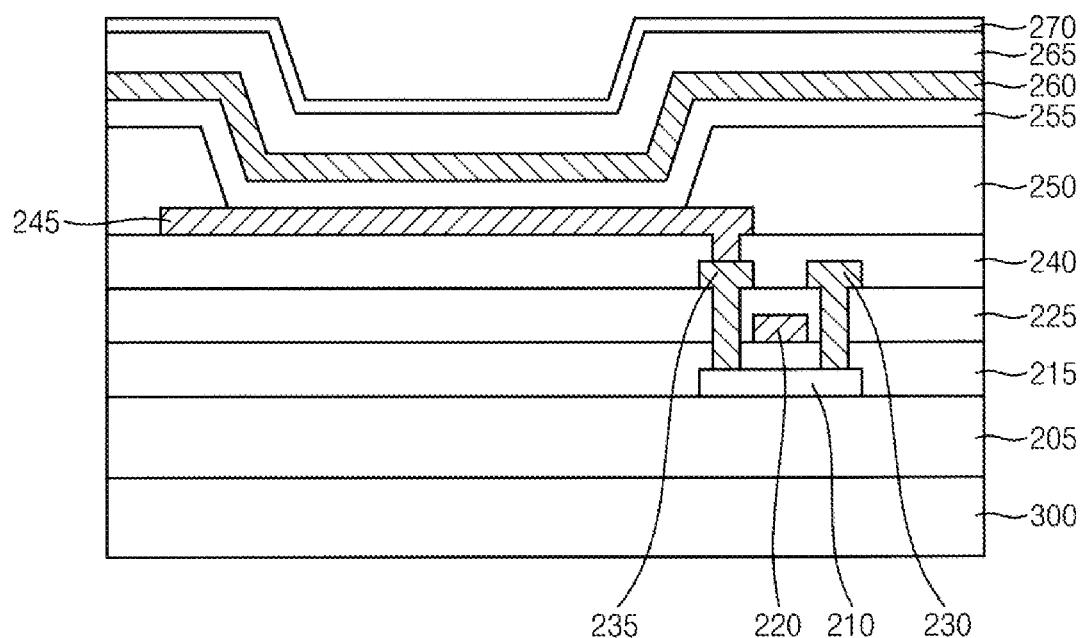

Referring to FIG. 11, an adhesion film 270 may be formed on the encapsulation layer 265 by coating an adhesion composition on the encapsulation layer 265. The adhesion composition may include a blue dye, a monomer such as an acryl-based monomer, a polymerization initiator and a solvent.

In example embodiments, the adhesion film 270 may be obtained by curing the adhesion composition by means of a thermal treatment or a UV irradiation after coating the adhesion composition onto the encapsulation layer 265. By curing the adhesion composition, the blue dye and the monomer may be combined and/or polymerized to obtain a polymer resin combined with the blue dye.

In some example embodiments, the blue dye may be distributed in the adhesion composition. In this case, the monomers may be polymerized and/or co-polymerized to obtain the polymer resin combined with the blue dye.

Figure 12:
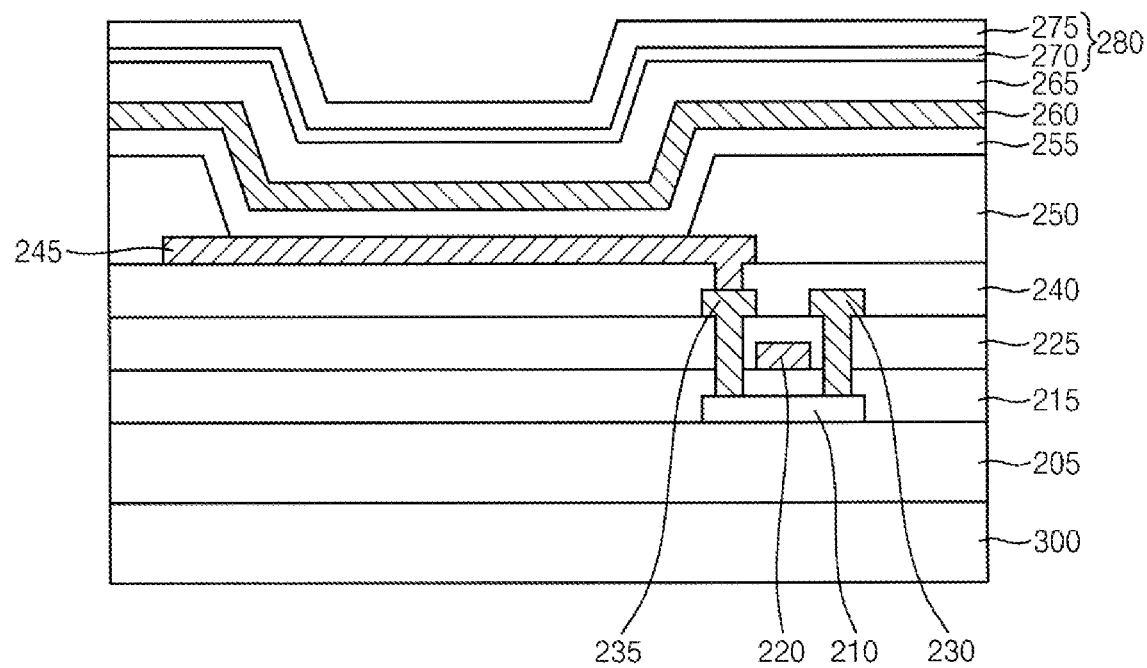

Referring to FIG. 12, a protection film 275 may be formed on the adhesion film 270 so as to prevent the underlying structures from impurities, moisture, scratch, etc. Thus, a protection layer 280 may be provided on the encapsulation layer 265. That is, the protection layer 280 may include a protection film 275 and adhesion film 270. For example, the protection film 275 may include a transparent resin such as polyethylene terephthalate, polycarbonate, polyvinyl chloride, etc. The protection film 275 may be formed of a transparent resin containing the above-described blue dye, so that the protection film 275 may also perform the color calibration of the image as adhesion film 270. In other example embodiments, an optical layer and an additional transparent substrate may be provided on the protection layer 280.

Figure 13:
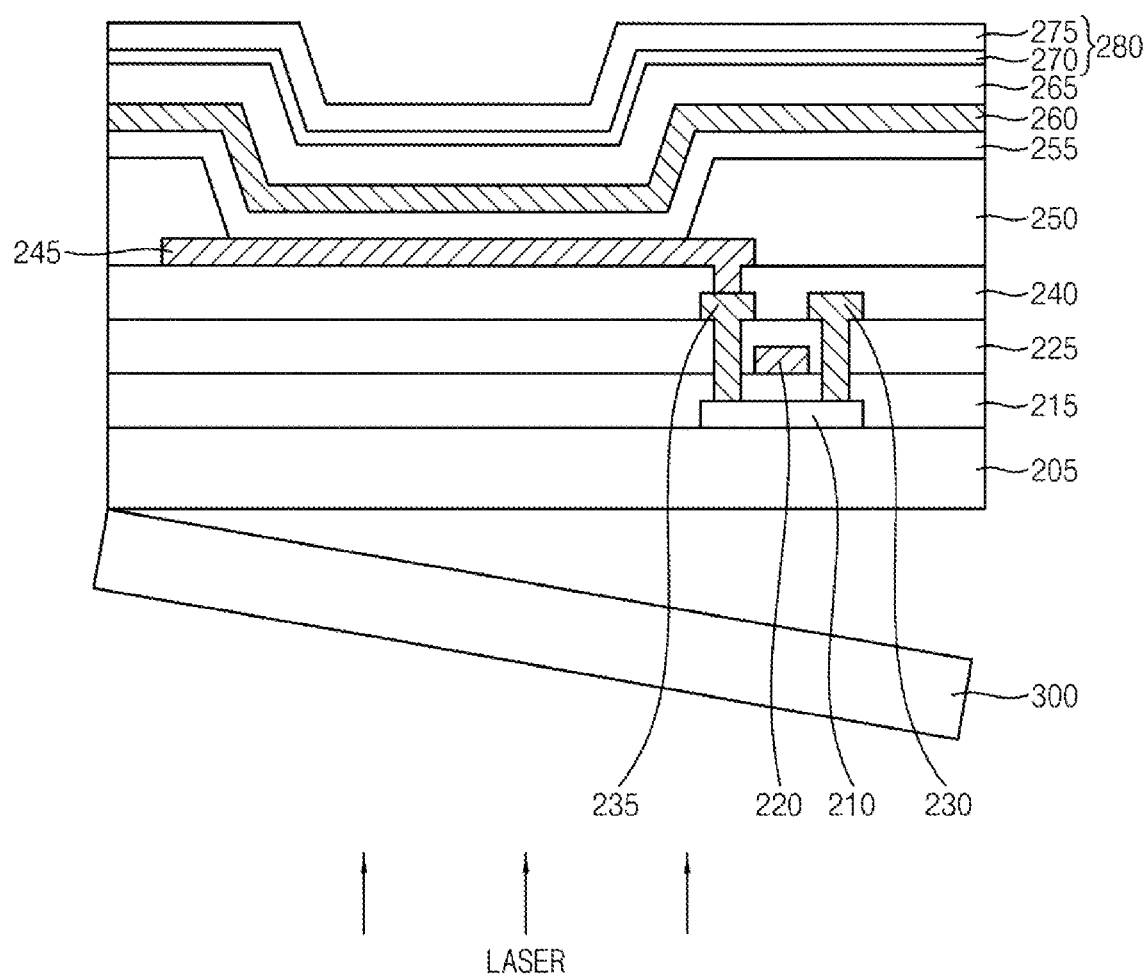
Figure 14:
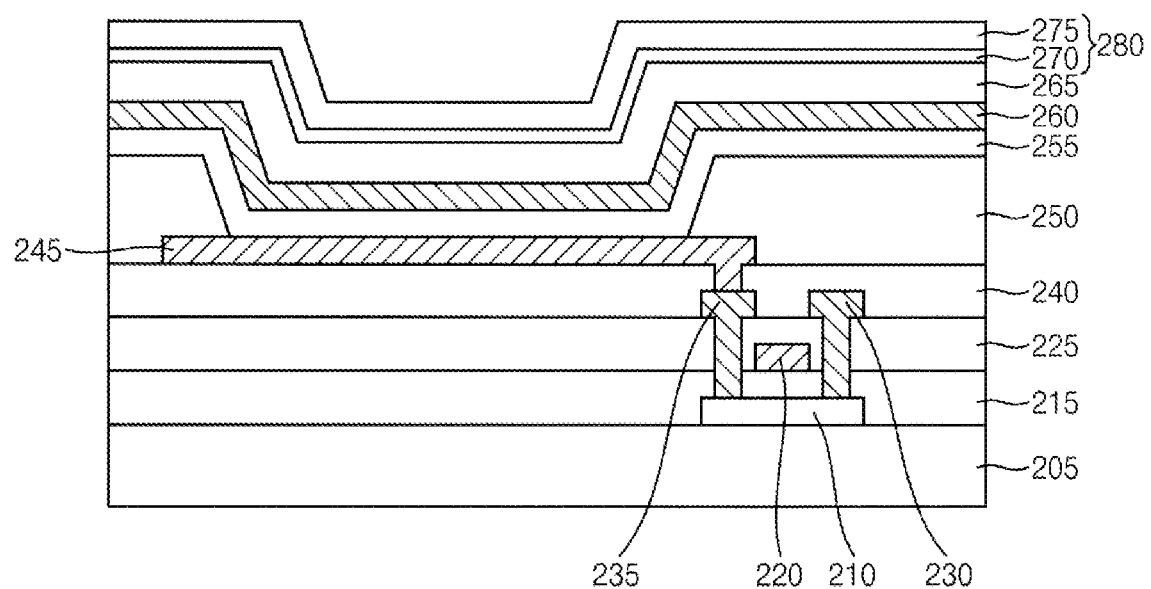

Referring to FIGS. 13 and 14, the carrier substrate 300 may be separated from the transparent base substrate 205 by irradiating a laser onto an interface between the carrier substrate 300 and the transparent base substrate 305, or by applying mechanical force to the interface between the carrier substrate 300 and the transparent base substrate 305.

According to example embodiments, the adhesion film and/or the protection film containing the blue dye may improve the transparency of the transparent base substrate by calibrating discoloration of the transparent base substrate. Thus, the transparent display device including the protection layer may ensure an enhanced transparency. Moreover, the transparent base substrate may have an enhanced mechanical strength and an increased heat resistance because of the charge transfer complex, so that the transparent display device may also have an enhanced mechanical strength and an increased heat resistance.

When the transparent organic light emitting display device applied to various display apparatuses for automobiles, vessels, aircrafts, smart windows, medical machines, telecommunication equipments, etc, the display apparatuses may ensure enhanced characteristics, for example, an improved mechanical strength, an increased transparency, an increased heat resistance, etc.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method of manufacturing a transparent organic light emitting display device, comprising:

forming a semiconductor device on a transparent base substrate;

forming an insulation layer on the transparent base substrate to cover the semiconductor device;

forming a display structure on the insulation layer, the display structure being electrically connected to the semiconductor device;

forming an encapsulation layer covering the display structure; and forming a protection layer including an adhesion film containing a blue dye and a protection film containing a blue dye on the encapsulation layer, wherein the blue dye is distributed in both of the adhesion film and the protection film to overlap the entire transparent base substrate, and wherein the transparent base substrate is a colored polymer substrate having a yellow color.

2. The method of claim 1, wherein forming the protection layer further comprises:

forming the adhesion film on a surface of the protection film, and wherein the blue dye is contained in at least one of the adhesion film and the protection film.

3. The method of claim 2, wherein forming the protection layer further includes attaching the adhesion film to the encapsulation layer.

4. The method of claim 2, wherein forming the adhesion film on a surface of the protection film further comprises:

coating an adhesion composition containing the blue dye, a monomer, a polymerization initiator and a solvent on the surface of the protection film, and wherein a polymer resin is formed by a polymerization of the blue dye and the monomer.

5. The method of claim 4, wherein the monomer includes an acryl-based monomer, and the polymer resin includes an acryl-based resin combined with the blue dye.

6. The method of claim 5, wherein the acryl-based monomer includes at least one selected from the group consisting of methacrylic acid, acrylic acid, methyl methacrylate, benzyl methacrylate, 2--hydroxyethyl methacrylate, aryl methacrylate and glycidyl methacrylate.

7. The method of claim 1, wherein forming the protection layer includes:

forming the adhesion film on an upper surface of the encapsulation layer; and forming the protection film on the adhesion film, and wherein the blue dye is contained in at least one of the adhesion film and the protection film.

8. The method of claim 7, wherein forming the adhesion film includes coating an adhesion composition containing the blue dye, a monomer, a polymerization initiator and a solvent onto the upper surface of the encapsulation layer, and wherein a polymer resin is formed by a polymerization of the blue dye and the monomer.

9. The method of claim 1, further comprising:

providing a carrier substrate;

forming the transparent base substrate on a carrier substrate; and separating the carrier substrate from transparent base substrate after forming of the encapsulation layer.

10. The method of claim 1, further comprising:

providing a carrier substrate;

forming the transparent base substrate on a carrier substrate; and separating the carrier substrate from transparent base substrate after forming of the protection layer.

* * * * *